United States Patent
Watanabe et al.

(10) Patent No.: US 10,601,417 B2
(45) Date of Patent: Mar. 24, 2020

(54) SWITCHING CIRCUIT AND METHOD OF MANUFACTURING SWITCHING CIRCUIT

(71) Applicant: DENSO CORPORATION, Kariya, Aichi-pref. (JP)

(72) Inventors: Yosuke Watanabe, Kariya (JP); Tomotaka Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/444,678

(22) Filed: Jun. 18, 2019

(65) Prior Publication Data
US 2019/0393873 A1 Dec. 26, 2019

(30) Foreign Application Priority Data
Jun. 26, 2018 (JP) .................. 2018-120954

(51) Int. Cl.
*H03K 17/687* (2006.01)
*H03K 17/567* (2006.01)
*H05K 1/02* (2006.01)

(52) U.S. Cl.
CPC ........ *H03K 17/567* (2013.01); *H05K 1/0262* (2013.01); *H05K 2201/093* (2013.01)

(58) Field of Classification Search
CPC ............ H03K 17/567; H03K 17/687; H03K 17/6877; H03K 17/063; H03K 17/04126; H03K 17/0822; H03K 17/56; H03K 17/94; H03K 3/017; H03K 7/08; H03K 19/00361; H05K 1/0262; H05K 2201/093; G01R 31/26; G01R 31/2621; H01L 21/76; H01L 21/762; H01L 21/822; H01L 27/04; H01L 27/1203; H02M 7/48; H02P 25/04; H02P 27/06; H04L 25/028; G06F 11/1443
See application file for complete search history.

(56) References Cited

U.S. PATENT DOCUMENTS

| | | | | |
|---|---|---|---|---|
| 9,025,266 B2* | 5/2015 | Miyagoe | ............ | H01L 27/0921 257/315 |
| 2014/0368145 A1* | 12/2014 | Miyachi | ............... | H02M 7/003 318/400.26 |
| 2015/0381151 A1 | 12/2015 | Kimura | | |

* cited by examiner

*Primary Examiner* — Long Nguyen
(74) *Attorney, Agent, or Firm* — Oliff PLC (57) ABSTRACT

A switching circuit includes a printed circuit board that supports a switching element, a positive power supply circuit, a negative power supply circuit and a driving circuit thereon. The positive power supply circuit generates a positive voltage relative to a GND potential. The negative power supply circuit generates a negative voltage relative to the GND potential. The driving circuit supplies the gate electrode with the positive voltage and the negative voltage when turn on and off the switching element, respectively. The printed circuit board includes wiring as a conducting path extended from the negative power supply circuit to the gate electrode via the driving circuit. The conducting path includes a negative power supply wiring between the negative power supply circuit and the driving circuit. The negative power supply wiring at least partially includes a negative power supply solid pattern.

11 Claims, 6 Drawing Sheets

SWITCHING CIRCUIT AND METHOD OF MANUFACTURING SWITCHING CIRCUIT

CROSS-REFERENCE TO RELATED APPLICATION

This patent application is based on and claims priority to Japanese Patent Application No. 2018-120954, filed on Jun. 26, 2018 in the Japan Patent Office, the entire disclosure of which is hereby incorporated by reference herein.

BACKGROUND

Technical Field

Embodiments of this disclosure relate to a switching circuit and a method of manufacturing the switching circuit.

Related Art

In general, when a switching element operating at a low turn on voltage is used and a ground potential is applied to a gate electrode thereof to turn off the switching element, the switching element is erroneously turned on sometimes by noise or the like, because a difference between the ground potential and the turn on voltage is small.

To resolve such a problem, a conventional negative power supply circuit applies a negative voltage to a gate electrode to turn off the switching element.

However, even with the conventional circuit, the switching element may be affected by noise or the like and erroneously operates depending on a pattern of wiring that constitutes a conducting path extended from the negative power supply circuit to the gate electrode via a driving circuit.

Hence, various embodiments of the present disclosure are herein below described in view of such a problem and an object of one of the various embodiments of the present disclosure is to provide a novel switching circuit capable of either suppressing or reducing erroneous turning on operation of the switching element.

SUMMARY

Accordingly, one aspect of the present disclosure provides a novel switching circuit that comprises: a printed circuit board composed of an insulation substrate and wiring disposed on the insulation substrate; a switching element composed of a gate electrode, the switching element disposed on the printed circuit board; and a positive power supply circuit to generate a positive voltage relative to a ground potential. The positive power supply circuit is disposed on the printed circuit board. A negative power supply circuit is provided to generate a negative voltage relative to the ground potential. The negative power supply circuit is disposed on the printed circuit board. A driving circuit is provided to supply a positive voltage to the gate electrode to turn on the switching element. The driving circuit supplies a negative voltage to the gate electrode to turn off the switching element. The wiring includes a conducting path from the negative power supply circuit to the gate electrode via the driving circuit. The conducting path includes a negative power supply wiring between the negative power supply circuit and the driving circuit. The negative power supply wiring at least partially includes a negative power supply solid pattern.

Another aspect of the present disclosure provides a novel method of manufacturing a switching circuit on a printed circuit board composed of an insulation substrate. The method includes the steps of: disposing a switching element with a gate electrode on the insulation substrate; disposing a positive power supply circuit on the insulation substrate to generate a positive voltage relative to a ground potential; and disposing a negative power supply circuit on the insulation substrate to generate a negative voltage relative to the ground potential. The method further includes the steps of: disposing a driving circuit on the insulation substrate to selectively supply a positive voltage and a negative voltage to the gate electrode to turn on and off the switching element, respectively; wiring the insulation substrate to electrically connect the switching element, the positive power supply circuit, the negative power supply circuit, and the negative power supply circuit; and forming a conducting path in a wiring portion from the negative power supply circuit to the gate electrode via the driving circuit. The method further includes the steps of: providing a negative power supply wiring in the conducting path between the negative power supply circuit and the driving circuit; and at least partially providing a negative power supply solid pattern in the negative power supply wiring.

Hence, according to one embodiment of the present disclosure, since the switching circuit includes a solid pattern at least as a part of the negative power supply wiring (i.e., a negative power supply solid pattern), an impedance of the negative power supply wiring and a difference in potential in the negative power supply wiring can be either suppressed or reduced. That is, fluctuation of the negative voltage can be either suppressed or reduced, accordingly. As a result, erroneous turning on operation of the switching element can be either suppressed or reduced.

BRIEF DESCRIPTION OF THE DRAWINGS

A more complete appreciation of the present disclosure and many of the attendant advantages of the present disclosure will be more readily obtained as substantially the same becomes better understood by reference to the following detailed description when considered in connection with the accompanying drawings, wherein.

DETAILED DESCRIPTION

Herein below, various embodiments of the present disclosure are described, wherein a thickness direction of a printed circuit board is referred to as a Z direction. A direction perpendicular to the Z direction is referred to as an X direction. A direction perpendicular to both of the X direction and the Y direction is referred to as a Y direction. Further, a shape in an X-Y plan view (i.e., a shape defined along an X-Y plane) is herein below premised as being planar unless otherwise specified. Here, the X-Y plane view can be a projection view in the Z direction as well.

Figure 1:
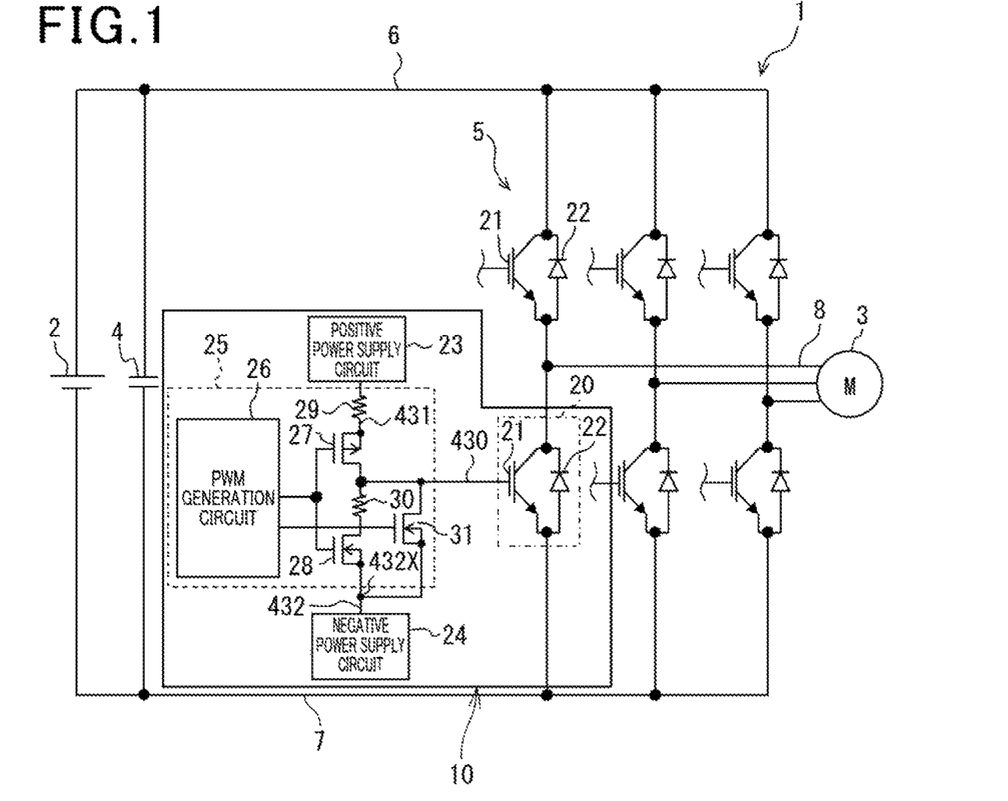
FIG. 1 is a diagram schematically illustrating a configuration of a power conversion system to which an exemplary switching circuit according to a first embodiment of the present disclosure is applied.

Referring now to the drawings, wherein like reference numerals designate identical or corresponding parts throughout the several views thereof, and in particular to FIG. 1, an outline of a power conversion system to which an exemplary switching circuit according to one embodiment of the present disclosure is applied is described.

The power conversion system 1 is, for example, mounted on an electric vehicle or a hybrid car. The power conversion system 1 is configured to convert a direct current voltage supplied from a direct current power supply 2 mounted on either the vehicle or the car into a three-phase alternating current and outputs a result of the conversion to a motor that operates in a three-phase alternating current system. The motor 3 functions as a driving source for a vehicle to run. The power conversion system 1 may also convert power generated by the motor 3 into a direct current and charges the direct current power supply 2 with the direct current. In this way, the power conversion system 1 is enabled to perform bi-directional power conversion.

The power conversion system 1 includes a smoothing capacitor 4 and an inverter 5. A terminal located on a cathode side of the smoothing capacitor 4 is connected to a cathode located on a high potential side of the direct current power supply 2 as an electrode. By contrast, a terminal on an anode side of the smoothing capacitor 4 is connected to an anode located on a low voltage side of the direct current power supply 2 as an electrode. An inverter 5 receives and converts the direct current power into a three-phase alternating current having a given frequency and outputs a result of the conversion to the motor 3. Besides, the inverter 5 converts an alternating current power generated by the motor 3 into a direct current power as well.

The inverter 5 may be composed of six arms by including upper and lower arm circuits for each of the three-phases. The upper and lower arm circuits of each of three-phases may be composed of a pair of arms connected in series between a cathode side line 6 acting as a cathode-side power supply line and an anode side line 7 acing as an anode-side power supply line. The cathode side line 6 is sometimes referred to as a high voltage power supply line. The anode side line 7 is also sometimes referred to as a low voltage power supply line as well. Respective connection points of the upper and lower arms of the phases are connected to output lines 8 extended to the motor 3.

Each of the arms is configured by including a switching element 20. In this embodiment of the present disclosure, the switching element 20 may be composed of an insulated-gate bipolar transistor 21 (herein below simply referred to as an IGBT 21). To the IGBT 21, a freewheeling diode 22 (herein below simply referred to as a FWD 22) is connected inversely parallel to recirculate a current. That is, in the switching element 20, a reverse conducting-IGBT (herein below simply referred to as a RC-IGBT) is included.

Here, the IGBT 21 employs a N-channel type. A collector electrode in the IGBT 21 constituting the upper arm is electrically connected to the cathode side line 6. An emitter electrode in the IGBT 21 constituting the lower arm is electrically connected to the anode side line 7. The emitter electrode of the IGBT 21 on the upper arm side and the collector electrode of the IGBT 21 on the lower arm side are connected to each other.

The power conversion system 1 includes a positive power supply circuit 23, a negative power supply circuit 24 and a driving circuit 25 or the like to operate the switching elements 20. The positive power supply circuit 23 functions as a positive power supply to supply a positive voltage relative to a ground potential (herein below referred to as a GND potential) as a reference. The negative power supply circuit 24 functions as a negative power supply to supply a negative voltage relative to the GND potential as a reference.

The driving circuit 25 outputs a gate driving signal to a gate electrode of the IGBT 21, thereby driving the IGBT 21 and consequently the switching element 20. The driving circuit 25 includes a PWM (pulse width modulation) generating circuit 26 and a pair of metal-oxide-semiconductor field-effect transistors (MOSFETs) 27 and 28 to switch a power supply from the positive power supply to the negative power supply vice versa. The PWM generating circuit 26 generates a PWM signal based on a driving instruction supplied from a control circuit (not illustrated) and outputs the PWM signal to a gate electrode of each of the MOSFETs 27 and 28. Hence, the PWM signal serves as a common driving signal supplied to the pair of MOSFETs 27 and 28.

The MOSFET 27 is a P-channel type. By contrast, the MOSFET 28 is an N-channel type. When the driving signal is a low (L) level, the MOSFET 27 is turned on while the MOSFET 28 is turned off. Subsequently, the positive power supply circuit 23 supplies the positive voltage to the gate electrode of the IGBT 21 through a resistance 29. This allows the IGBT 21 to enter a turn on state. By contrast, when the driving signal is a high (H) level, the MOSFET 27 is turned off while the MOSFET 28 is turned on. Hence, the negative power supply circuit 24 supplies the negative voltage to the gate electrode of the IGBT 21 through a resistance 30. This allows the IGBT 21 to enter a turn off state. Here, the resistance 29 is disposed in a wiring that connects a source electrode of the MOSFET 27 with the positive power supply circuit 23. Similarly, the resistance 30 is disposed on a wiring that connects a drain electrode of the MOSFET 28 with a connection point between the MOSFETs 27 and 28.

The driving circuit 25 further includes a turn off holding circuit 31. The turn off holding circuit 31 employs a N-channel type MOSFET. The turn off holding circuit 31 is connected parallel to the MOSFET 28. When the turn off holding circuit 31 is turned on, the gate electrode of the IGBT 21 is electrically connected to the negative power supply circuit 24, and a charge is pulled out from the gate electrode thereof.

That is, the resistance 30 is disposed in a gate wiring extended between the MOSFET 28 and the gate electrode of the IGBT 21. By contrast, no resistance (e.g., a resistive element) is disposed on a gate wiring extended between the turn off holding circuit 31 and the gate electrode of the IGBT 21. Hence, when the turn off holding circuit 31 is turned on, the negative power supply circuit 24 supplies the negative voltage to the gate electrode of the IGBT 21 without passing the resistance 30. Thus, an impedance of the gate wiring extended from the turn off holding circuit 31 is less than that of the gate wiring extended from the MOSFET 28.

When the MOSFET 28 is turned on, and accordingly, the gate voltage (Vge) of the IGBT 21 decreases, for example, to a prescribed degree, the PWM generating circuit 26 outputs a driving signal of a high (H) level to the turn off holding circuit 31. This allows the turn off holding circuit 31 to enter a turn on state and electric charge is drained from the gate electrode of the IGBT 21 thereby immediately bringing the IGBT 21 into a turn off state. In this way, the turn off holding circuit 31 holds the turn off state of the IGBT 21. More specifically, the turn off holding circuit 31 maintains the turn off state of the IGBT 21 when the MOSFET 27 is turned on.

Here, as described earlier, when a turn on voltage of the IGBT is low and a GND potential (a voltage) is applied to the gate electrode of the IGBT to turn off the same, since a difference between the turn on voltage and the GND potential is small, the IGBT may erroneously be tuned on by a noise or the like. By contrast, according to this embodiment of the present disclosure, a negative voltage is applied to the gate electrode of the IGBT 21 to turn off the IGBT 21. With this, since a difference between the turn on-voltage and the negative voltage becomes greater than that between the turn on-voltage and the GND potential, erroneous turning on operation of the IGBT 21 can be either inhibited or reduced.

In particular, in this embodiment of the present disclosure, the switching element 20 employs a semi-conductor substrate made of material, such as SiC (Silicon Carbide), GaN (Gallium Nitride), etc., having a lower turn on resistance than Si (Silicon). Accordingly, the turn on voltage of the IGBT 21 can be lowered, however, the erroneous turn on operation can be either prevented or reduced by the above-described configuration.

The switching circuit 10 of this embodiment of the present disclosure may be composed of a switching element 20, the positive power supply circuit 23, the negative power supply circuit 24, the driving circuit 25, and corresponding one of the arms that constitute the inverter 5. Although it is omitted from FIG. 1 for the sake of convenience, each of remaining five switching circuits 10 is similarly configured and disposed to correspond to remaining five arms that constitute the inverter 5, respectively. That is, the driving circuit 25 or the like is similarly provided for each of the IGBTs 21.

Figure 2:
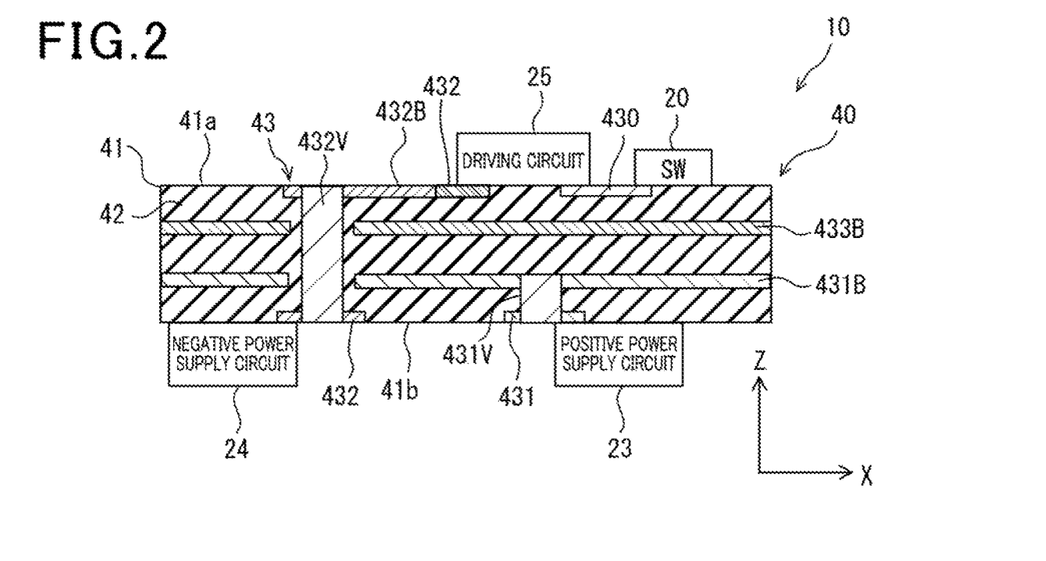
FIG. 2 is a cross-sectional view illustrating an exemplary configuration of a printed circuit board that supports the switching circuit of the first embodiment of the present disclosure.

Now, an exemplary configuration of a printed circuit board is herein below described with reference to FIGS. 2 and 3 and applicable drawings, and in particular, FIG. 2 is a cross-sectional view taken along a line II-II drawn in FIG. 3. As illustrated, the switching circuit 10 is established on a circuit board 40.

The circuit board 40 may be composed of a printed circuit board 41, on which various parts constituting the switching element 20, the positive power supply circuit 23, the negative power supply circuit 24 and the driving circuit 25 are mounted. Each of the positive power supply circuit 23, the negative power supply circuit 24 and the driving circuit 25 may be configured as either a single part or multiple parts (i.e., elements). Hence, in FIGS. 2 and 3, each of the positive power supply circuit 23, the negative power supply circuit 24 and the driving circuit 25 is illustrated in a single block.

As illustrated, a printed circuit board 41 is provided and includes an insulation substrate 42 and wiring 43 disposed thereon. In this embodiment of the present disclosure, the wiring 43 is multilayered. Specifically, four layers of the wiring 43 are disposed. The wiring 43 may be composed of a wiring pattern prepared by patterning a metal foil (e.g. a copper foil), for example, and an inner layer connector that connects respective wiring patterns disposed on the different layers with each other. As the inter layer connector, for example, a via can be employed. However, only a portion of the wiring 43 is illustrated in FIGS. 2 and 3 for the sake of convenience.

The switching element 20 and the driving circuit 25 are disposed on a first side 41a of the printed circuit board 41 when viewed in a thickness direction of the printed circuit board 41 (i.e., a Z direction). On a rear side 41b opposite the first side 41a of the printed circuit board 41, the positive power supply circuit 23 and the negative power supply circuit 24 are disposed. The wiring 43 on the first side 41a is herein below referred to as wiring on a first layer.

The wiring 43 includes various portions to constitute the switching circuit 10. For example, a gate wiring 430 that connects the gate electrode of the switching element 20 (i.e., IGBT 21) with the driving circuit 25, a positive power supply wiring 431 that connects the positive power supply circuit 23 with the driving circuit 25 (MOSFET 27), and a negative power supply wiring 432 that connects the negative power supply circuit 24 with the driving circuit 25 (MOSFET 28) are included in the wiring 43. Further included in the wiring 43 is a GND solid pattern 433B. Multiple parts, such as the switching element 20, etc., are connected to corresponding wiring 43 by either soldering or bonding the wires and the like. Here, the GND solid pattern 433B is equivalent to a ground solid pattern.

The gate wiring 430 is disposed on the surface layer of the first side 41a. The gate wiring 430 is constituted only by a wiring pattern.

The positive power supply wiring 431 is disposed to electrically connect the positive power supply circuit 23 disposed on the rear side 4 lb with the driving circuit 25 disposed on the first side 41a. The positive power supply wiring 431 includes a positive power supply solid pattern 431B as a part of the wiring pattern. As illustrated, the positive power supply solid pattern 431B is disposed, for example, on a third layer. Again, multiple wiring patterns formed on different layers are connected with each other by one or more inter layer connectors 431V.

The negative power supply wiring 432 electrically connects the negative power supply circuit 24 disposed on the rear side 41b with the driving circuit 25 disposed on the first side 41a. The negative power supply wiring 432 includes a negative power supply solid pattern 432B as a part of the wiring pattern. As shown there, the negative power supply solid pattern 432B is disposed in a first layer, for example.

In this embodiment of the present disclosure, wiring that connects the source electrode of the MOSFET 28 with the negative power supply circuit 24 and wiring that connects the source electrode of the turn off holding circuit 31 with the negative power supply circuit 24 collectively corresponds to the negative power supply wiring 432. Further, as illustrated in FIGS. 1 and 3, respective emitter electrodes of the MOSFET 28 and the turn off holding circuit 31 are connected to each other at a connection point 432X. A common wiring portion extends from the connection point 432X to the negative power supply circuit 24. In this embodiment of the present disclosure, the negative power supply solid pattern 432B is provided in the common wiring portion.

Again, wiring patterns formed on different layers respectively are connected to each other by one or more inter layer connectors 432V. Hence, when the wiring between the different layers via the inter layer connectors 432V is repeated several times, a length of the wiring, and accordingly that of the negative power supply wiring becomes longer. Therefore, a wiring impedance increases as a result. To reduce the wiring impedance, it is preferable to minimize the number of times the inter layer connectors 432V are used.

Further, the GND solid pattern 433B is provided on a third layer. The GND solid pattern 433B is disposed to overlap with the negative power supply solid pattern 432B in a projection view taken along the Z direction. Specifically, the GND solid pattern 433B is disposed to almost cover the negative power supply solid pattern 432B in the view.

Figure 3:
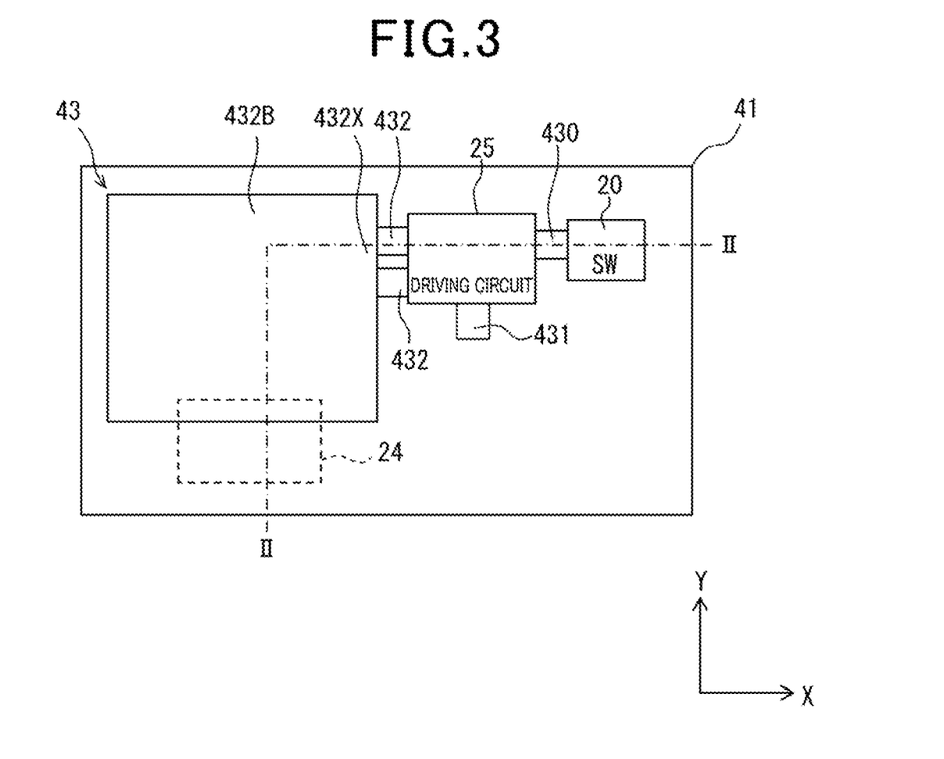
FIG. 3 is a plan view illustrating the configuration of the printed circuit board that supports the switching circuit of the first embodiment of the present disclosure.

In this way, according to the switching circuit 10 of this embodiment of the present disclosure, out of multiple portions of the wiring 43 composed of a conducting path extended from the negative power supply circuit 24 to the gate electrode of the switching element 20 via the driving circuit 25, the negative power supply solid pattern 432B is disposed in a portion of the negative power supply wiring 432 as illustrated in FIG. 3. Hence, since the impedance is reduced by the negative power supply solid pattern 432B while either suppressing or reducing a difference in electric potential in the negative power supply wiring 432, fluctuation of the negative voltage can be either reduced or suppressed. Accordingly, erroneous switching on operation of the switching element 20 (i.e., IGBT 21) can be either reduced or suppressed, accordingly.

In particular, in this embodiment of the present disclosure, the negative power supply solid pattern 432B is provided in the common wiring portion out of the entire negative power supply wiring 432. Hence, the impedance in each of the gate wirings extended from the MOSFET 28 and the turn off holding circuit 31 can considerably be reduced. In particular, an impact of the reduction of impedance in the gate wiring extended from the turn off holding circuit 31 to the gate electrode of the IGBT 21 is great as the conduction path. That is, the gate wiring excludes the resistance 30 therefrom. Hence, fluctuation of the negative voltage can effectively be either suppressed or reduced, thereby effectively inhibiting the erroneous turn on operation of the IGBT 21 in the switching element 20.

Further, as illustrated in FIG. 2, on a layer next to the negative power supply solid pattern 432B in the Z direction, the GND solid pattern 433B is disposed. With this, an impact of an external noise can be at least reduced. In particular, since the GND solid pattern 433B is disposed between the negative power supply solid pattern 432B and the positive power supply solid pattern 431B, the GND solid pattern 433B can reduce the impact of a voltage of the positive power supply solid pattern 431B.

Now, a second embodiment of the present disclosure is described with reference to FIGS. 4 and 5 and applicable drawings. Since some devices employed in a switching circuit 10 of this embodiment of the present disclosure are substantially the same as those in the above-described first embodiment of the present disclosure, description of those are not repeated.

Figure 4:
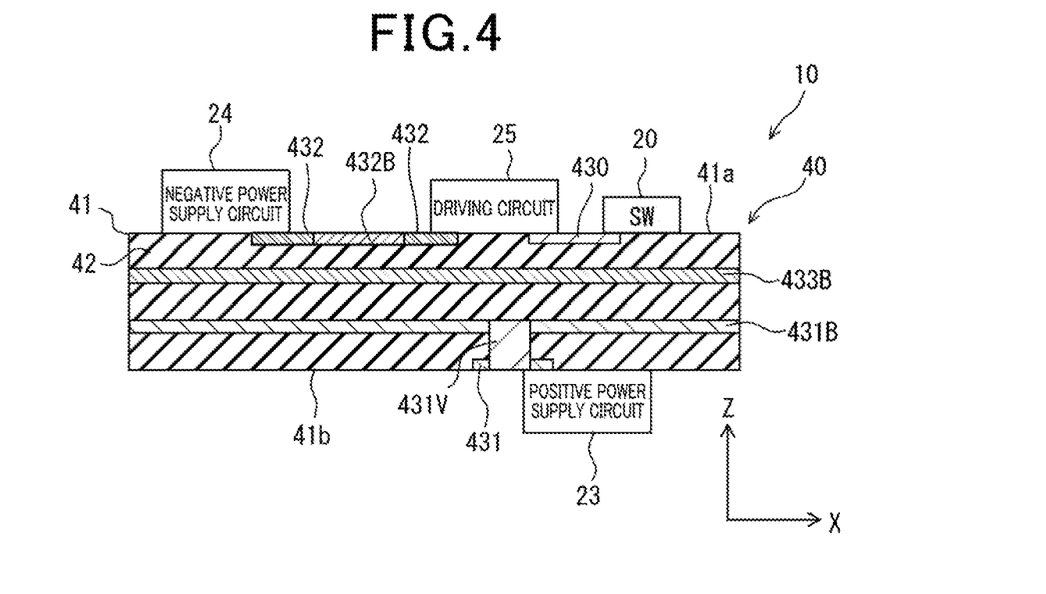
FIG. 4 is a cross-sectional view illustrating an exemplary configuration of a printed circuit board that supports a switching circuit applied to the power conversion system as a second embodiment of the present disclosure.
Figure 5:
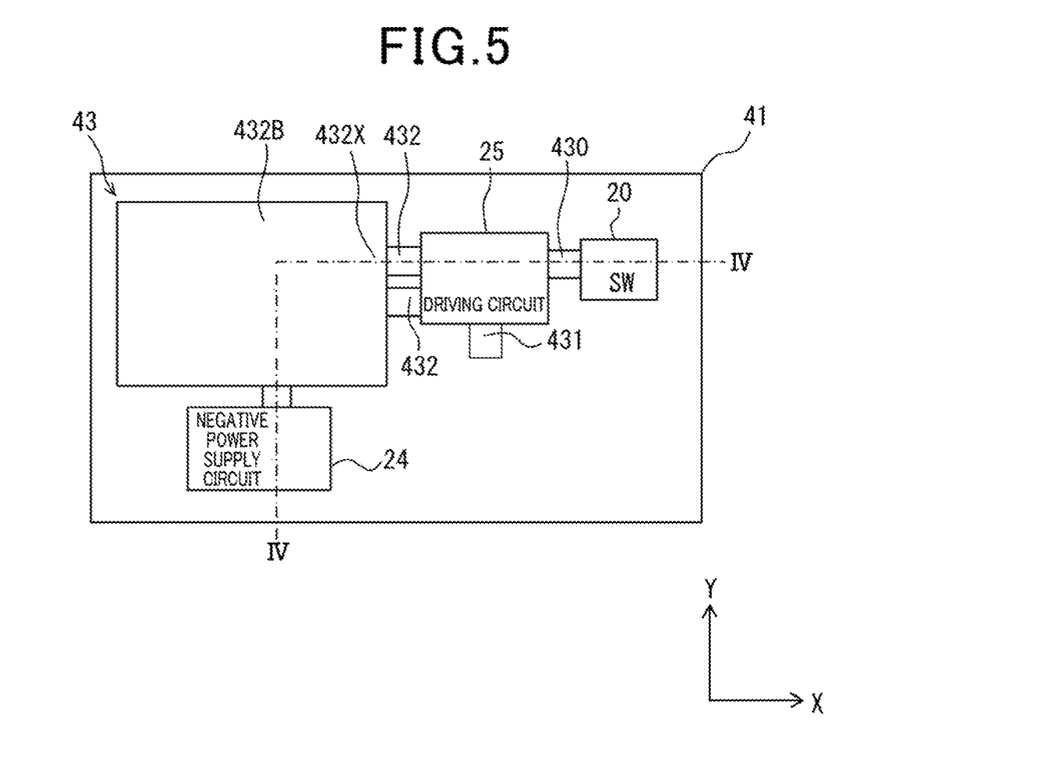
FIG. 5 is a plan view illustrating the configuration of the printed circuit board that supports the switching circuit of the second embodiment of the present disclosure.

First, as illustrated in FIGS. 4 and 5, in this embodiment of the present disclosure, the negative power supply circuit 24 is additionally disposed on the first side 41a of the printed circuit board 41. Here, FIG. 4 is a cross-sectional view taken along a line IV-IV drawn in FIG. 5. That is, the negative power supply circuit 24, all of negative power supply wiring 432 including a negative power supply solid pattern 432B, and the driving circuit 25 are disposed on the first side 41a. Accordingly, however, the negative power supply wiring 432 excludes the inter layer connector 432V as different from the first embodiment of the present disclosure.

According to this, a length of the negative power supply wiring 432 of this embodiment of the present disclosure can be shortened when compared with the negative power supply wiring 432 of the first embodiment that includes the inter layer connector 432V. With this, an impedance of the negative power supply wiring 432 can be reduced effectively again.

Further, in this embodiment of the present disclosure, all of the wiring 43 that constitutes the conducting path extended from the negative power supply circuit 24 to the switching element 20 is disposed on the first side 41a. In this way, because the inter layer connector is entirely excluded from the conducting path, the impedance can be further reduced.

Further, as illustrated in FIG. 5, according to this embodiment of the present disclosure, the driving circuit 25 is disposed closer to the switching element 20 rather than the negative power supply circuit 24 on the X-Y plane. Thus, since the driving circuit 25 is closer to the switching element 20 than to the negative power supply circuit 24, a length of the gate wiring 430 can be shortened, thereby reducing the impedance thereof. Therefore, fluctuation of the negative voltage near the gate electrode can be either suppressed or reduced, thereby effectively inhibiting the erroneous turn on operation of the IGBT 21 in the switching element 20.

Now, a third embodiment of the present disclosure is described with reference to FIG. 6 and applicable drawings. Again, since some devices employed in a switching circuit 10 of this embodiment of the present disclosure are substantially the same as those in the above-described first and second embodiments of the present disclosure, description of such devices are not repeated.

Figure 6:
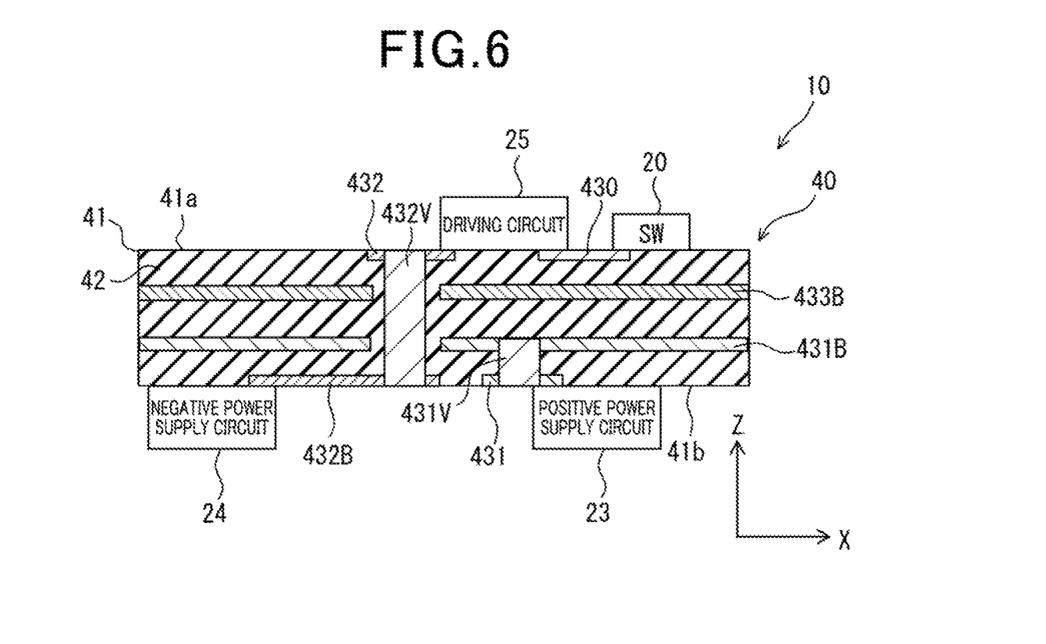
FIG. 6 is a cross-sectional view illustrating an exemplary configuration of a printed circuit board that supports a switching circuit applied to the power conversion system as a third embodiment of the present disclosure.

That is, as illustrated in FIG. 6, in this embodiment of the present disclosure, a negative power supply solid pattern 432B is disposed on a surface layer of the rear side 41b. The remaining configuration is substantially the same as in the first embodiment of the present disclosure. Specifically, the switching element 20 (i.e., IGBT 21) and the driving circuit 25 (i.e., MOSFETs 27 and 28) are disposed on the first side 41a.

In this way, since the negative power supply solid pattern 432B is disposed away from both of the switching element 20 and the driving circuit 25, an impact of switching noise can be either suppressed or reduced. That is, fluctuation of a negative voltage possibly caused by the switching noise can be either suppressed or reduced, thereby effectively inhibiting the erroneous turn on operation of the IGBT 21 in the switching element 20.

Although FIG. 6 illustrates an example in which the negative power supply circuit 24 is disposed on the rear side 41*b*, the present invention is not limited to this. That is, the negative power supply circuit 24 can be disposed on the first side 41*a* together with the switching element 20 and the driving circuit 25 while the negative power supply solid pattern 432B can be disposed on a surface layer of the rear side 41*b*. However, since the inter layer connector 432V becomes lengthy, the configuration of FIG. 6 is more preferable to reduce an impedance thereof.

Now, a fourth embodiment of the present disclosure is described with reference to FIG. 7 and applicable drawings. Again, since some devices employed in a switching circuit 10 of this embodiment of the present disclosure are substantially the same as those in the above-described first to third embodiments of the present disclosure, description of such devices are not repeated.

Figure 7:
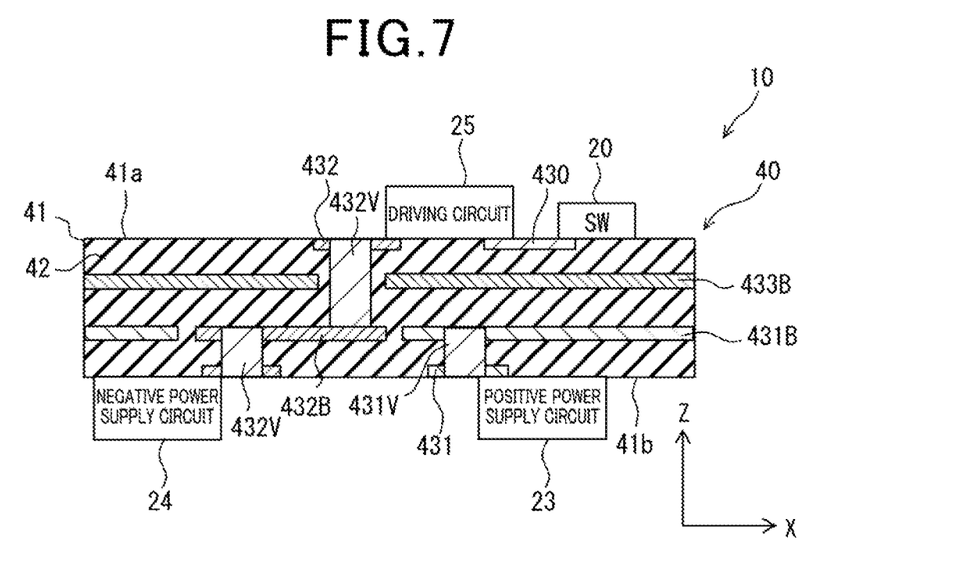
FIG. 7 is a cross-sectional view illustrating an exemplary configuration of a printed circuit board that supports a switching circuit applied to the power conversion system as a fourth embodiment of the present disclosure.

As illustrated in FIG. 7, in this embodiment of the present disclosure, at least a part of the negative power supply solid pattern 432B is provided on an inner layer of the printed circuit board 41. Specifically, the negative power supply solid pattern 432B is disposed on a third layer, for example.

In addition, a GND solid pattern 433B is disposed on a different layer from a layer, on which the negative power supply solid pattern 432B is disposed at least partially overlapping with the negative power supply solid pattern 432B in a projection view taken in the Z direction. Hence, since the GND solid pattern 433B functions as a noise shield, an impact of noise disturbance on the negative power supply wiring 432 can be reduced. Accordingly, fluctuation of the negative voltage can be suppressed again. Further, in this embodiment of the present disclosure, since the GND solid pattern 433B on the second layer is disposed to almost wrapping the negative power supply solid pattern 432B, the advantage can be enhanced.

As described above, according to this embodiment of the present disclosure, both of the switching element 20 (i.e., IGBT 21) and the driving circuit 25 (i.e., MOSFETs 27 and 28) are disposed on the first side 41*a*, and the negative power supply solid pattern 432B is disposed on the inner layer closer to the rear side 41*b* than to the first side 41*a*. In this way, since the negative power supply solid pattern 432B is disposed away from both of the switching element 20 and the driving circuit 25, an impact of switching noise can be suppressed. In particular, as shown, in this embodiment of the present disclosure, since the negative power supply solid pattern 432B is disposed on the inner layer closest to the rear side 41*b*, the impact of switching noise thereon can be effectively either suppressed or reduced, thereby effectively inhibiting the erroneous turn on operation of the IGBT 21 in the switching element 20.

Now, a fifth embodiment of the present disclosure is described with reference to FIG. 8 and applicable drawings. Since some devices employed in a switching circuit 10 of this embodiment of the present disclosure are substantially the same as those in the above-described first to fourth embodiments of the present disclosure, description of such devices is not repeated again.

Figure 8:
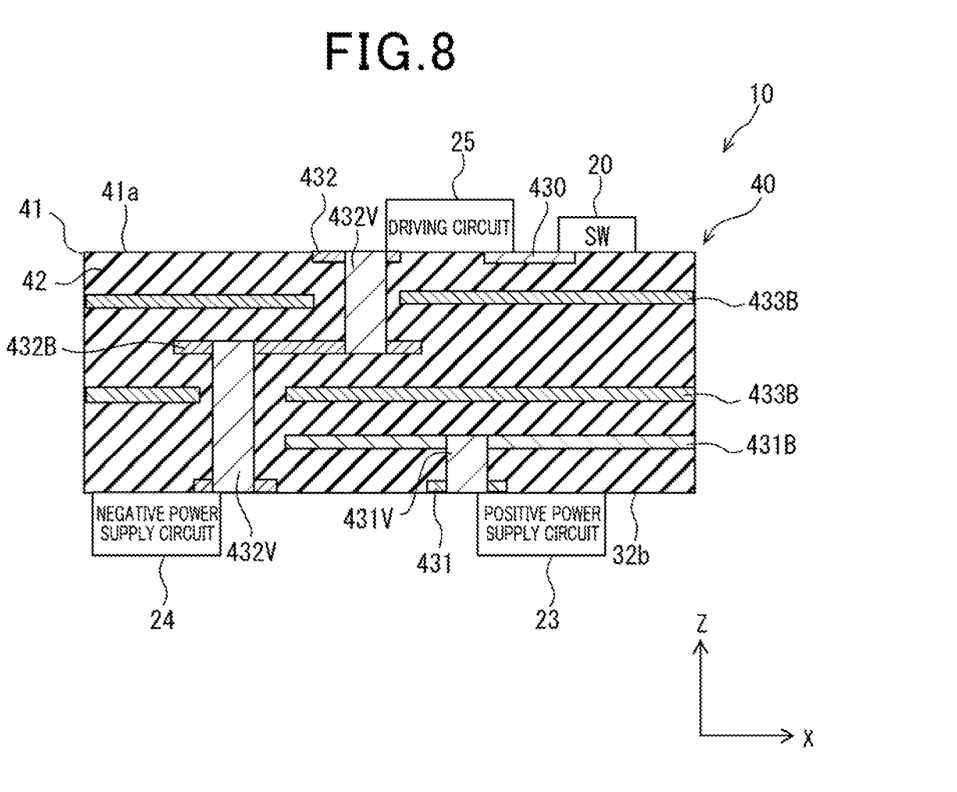
FIG. 8 is a cross-sectional view illustrating an exemplary configuration of a printed circuit board that supports a switching circuit applied to the power conversion system as a fifth embodiment of the present disclosure.

In this embodiment of the present disclosure, at least a part of a negative power supply solid pattern 432B is provided on an inner layer of the printed circuit board 41 again as illustrated in FIG. 8. The printed circuit board 41 employs a six layer substrate, in which the negative power supply solid pattern 432B is disposed on a third layer, for example. The positive power supply solid pattern 431B is disposed on a fifth layer. Two GND solid patterns 433B are disposed on the second and fourth layers, respectively.

As shown, the GND solid patterns 433B are disposed to almost sandwich the negative power supply solid pattern 432B in the Z direction. Hence, an impact of noise disturbance caused in each of positive and negative Z directions can be reduced. Accordingly, fluctuation of the negative voltage due to noise disturbance can be effectively either reduced or suppressed, thereby effectively inhibiting erroneous turn on of the IGBT 21 in the switching element 20. In particular, in this embodiment of the present disclosure, since the GND solid patterns 433B on both of the inner layers are disposed to almost wrap up the negative power supply solid pattern 432B in a projection view taken in the Z direction, an impact of noise disturbance thereon can be more effectively reduced.

Further, the GND solid pattern 433B formed on the fourth layer is also disposed between the negative power supply solid pattern 432B and the positive power supply solid pattern 431B when viewed in the Z direction. In this way, since the GND solid pattern 433B intervenes between the negative power supply solid pattern 432B and the positive power supply solid pattern 431B, an impact of a voltage of the positive power supply solid pattern 431B thereon can be reduce by the GND solid pattern 433B, thereby more effectively inhibiting the erroneous turn on operation of the IGBT 21 in the switching element 20, thereby effectively inhibiting the erroneous turn on operation of the IGBT 21 in the switching element 20.

Now, a sixth embodiment of the present disclosure is described with reference to FIG. 9 and applicable drawings. Since some devices employed in a switching circuit 10 of this embodiment of the present disclosure are substantially the same as those in the above-described first to fifth embodiment of the present disclosure, description of such devices are not repeated again.

Figure 9:
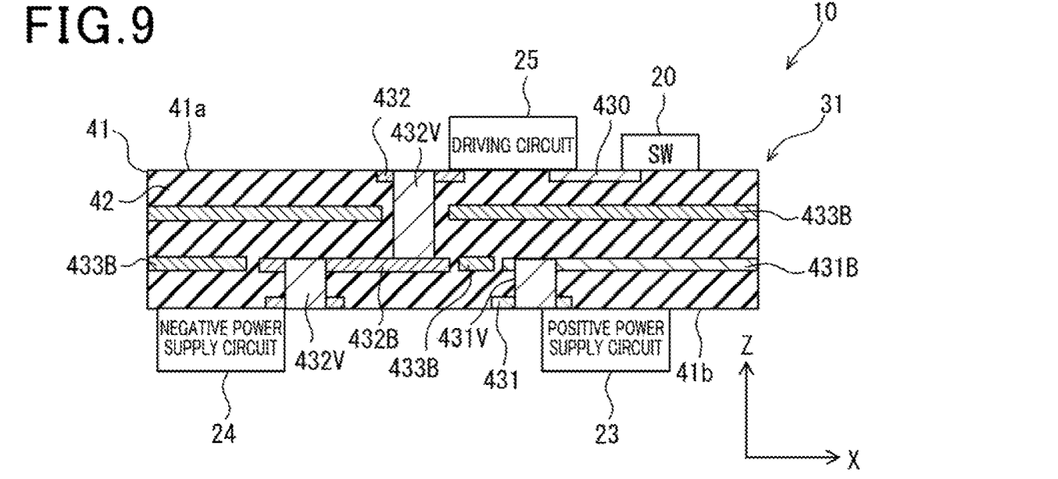
FIG. 9 is a cross-sectional view illustrating an exemplary configuration of a printed circuit board that supports a switching circuit applied to the power conversion system as a sixth embodiment of the present disclosure.

As illustrated in FIG. 9, in this embodiment of the present disclosure, at least a part of the negative power supply solid pattern 432B is provided on an inner layer of the printed circuit board 41. The negative power supply solid pattern 432B is disposed on a third layer, for example. The positive power supply solid pattern 431B is also disposed on the third layer as well.

Further, the GND solid pattern 433B is also disposed on the third layer between the positive power supply solid pattern 431B and the negative power supply solid pattern 432B. In this way, since the GND solid pattern 433B intervenes between the positive power supply solid pattern 431B and the negative power supply solid pattern 432B, an impact of a voltage of the positive power supply solid pattern 431B can be reduced by the GND solid pattern 433B.

Although the GND solid pattern 433B is disposed on the same inner layer of the printed circuit board 41 between the positive power supply solid pattern 431B and the negative power supply solid pattern 432B as shown in FIG. 9, the present invention is not limited thereto. That is, the GND solid pattern 433B can be disposed on the surface layer of the first side 41*a* of the printed circuit board 41 between the positive power supply solid pattern 431B and the negative power supply solid pattern 432B. Also, the GND solid pattern 433B can be disposed on the surface layer of the rear side 41*b* of the printed circuit board 41 between the positive power supply solid pattern 431B and the negative power supply solid pattern 432B as well.

Now, a seventh embodiment of the present disclosure is described with reference to FIGS. 10 and 11 and applicable drawings. Again, since some devices employed in a switching circuit 10 of this embodiment of the present disclosure are substantially the same as those in the first to sixth embodiments of the present disclosure, description of such devices is not repeated.

Figure 10:
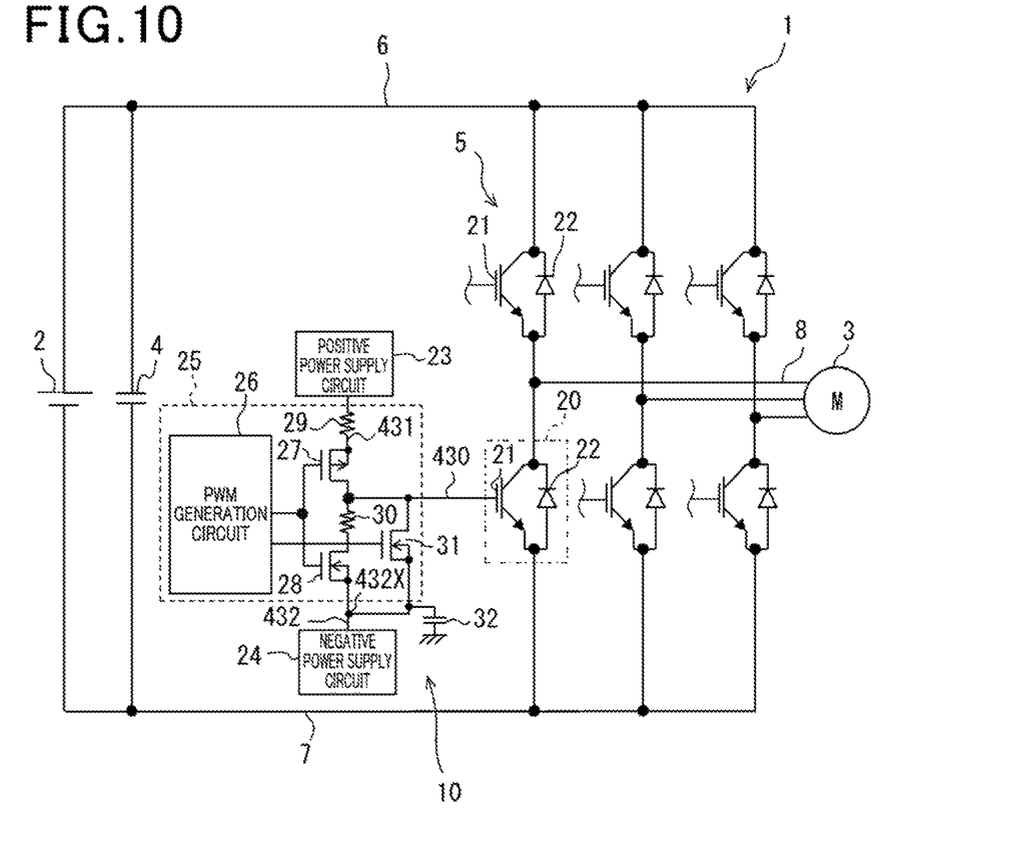
FIG. 10 is a diagram schematically illustrating a configuration of another power conversion system to which an exemplary switching circuit according to a seventh embodiment of the present disclosure is applied.
Figure 11:
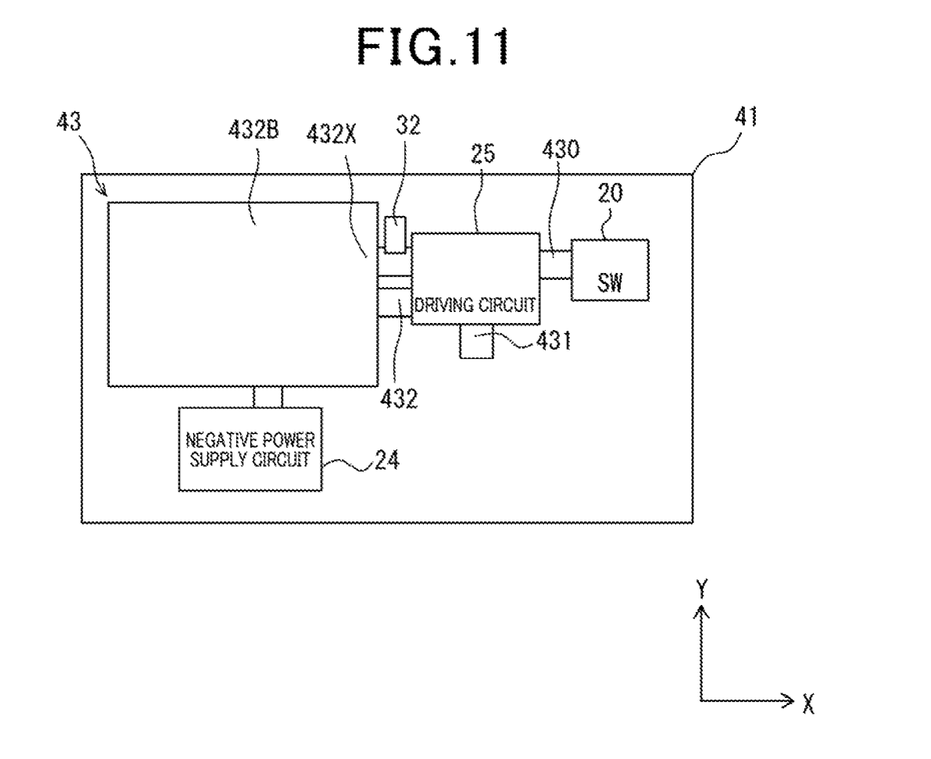
FIG. 11 is a plan view illustrating a configuration of a printed circuit board that supports the switching circuit of the seventh embodiment of the present disclosure corresponding to FIG. 5.

As illustrated in FIGS. 10 and 11, in this embodiment of the present disclosure, a switching circuit 10 further includes a capacitor 32. The capacitor 32 is disposed between the negative power supply wiring 432 and ground (GND). In this way, since the capacitor 32 is disposed closer to a gate electrode than to the negative power supply circuit 24, an electric charge pulled out from the gate electrode can charge the capacitor 32 when a voltage is switched from the positive voltage to the negative voltage. That is, fluctuation of the negative voltage can be either suppressed or reduced, thereby effectively inhibiting the erroneous turn on operation of the IGBT 21 in the switching element 20.

Further, out of the negative power supply wiring 432, the capacitor 32 is connected to a source electrode of the turn off holding circuit 31 and a connection point 432X therebetween. Hence, the capacitor 32 is disposed closer to the driving circuit 25 than to the negative power supply circuit 24. Thus, since the capacitor 32 is disposed closer to the gate electrode of the IGBT 21, fluctuations of the negative voltage can be effectively either suppressed or reduced.

Heretofore, the RC-IGBT is exemplified as the switching element 20. However, the present invention is not limited thereto and a MOSFET can be employed as the switching element 20, for example.

The present invention is not limited to each of the above-described printed circuit boards 41 having the respective numbers of layers. That is, the printed circuit board 41 can be composed of the optional number of layers.

Further, a manner of arrangement of the wiring 43 on the printed circuit board 41 is not limited to the manner as described heretofore.

Heretofore, the switching circuit 10 is applied to the inverter 5. However, the present invention is not limited thereto and the switching circuit 10 can be applied to other devices. Further, the motor 3 is exemplified as a load (i.e., an inductive load), the present invention is not limited thereto.

Further, although the driving circuit 25 includes the turn off holding circuit 31 in one embodiment of the present disclosure, the present invention is not limited thereto, and the driving circuit 25 may exclude the turn off holding circuit 31. In such a situation (i.e., the turn off holding circuit 31 is excluded), the capacitor 32 can be disposed in the negative power supply wiring 432 that connects the MOSFET 28 with the negative power supply circuit 24.

Further, although the connection point 432X is established outside of the driving circuit 25 in one embodiment of the present disclosure, the present invention is not limited thereto, and the connection point 432X can be established in the driving circuit 25.

Further, although the negative power supply solid pattern 432B is established at least in a common wiring portion between the connection point 432X and the negative power supply circuit 24, the present invention is not limited thereto. That is, the negative power supply wiring 432 can at least partially include the negative power supply solid pattern 432B.

For example, the negative power supply solid pattern 432B can be established between the turn off holding circuit 31 and the connection point 432X. When the negative power supply solid pattern 432B is established on a side of the turn off holding circuit 31, fluctuation of the negative voltage can be effectively suppressed as described earlier. Hence, the negative power supply solid pattern 432B can be established only between the turn off holding circuit 31 and the negative power supply circuit 24. The negative power supply solid pattern 432B can also be established in a portion between the MOSFET 28 and the connection point 432X as well.

Numerous additional modifications and variations of the present disclosure are possible in light of the above teachings. It is therefore to be understood that within the scope of the appended claims, the present disclosure may be executed otherwise than as specifically described herein. For example, the switching circuit is not limited to the above-described various embodiments and may be altered as appropriate. Similarly, the method of manufacturing a switching circuit is not limited to the above-described various embodiments and may be altered as appropriate.

What is claimed is:

1. A switching circuit, comprising:
   a printed circuit board composed of an insulation substrate and wiring disposed on the insulation substrate;
   a switching element composed of a gate electrode, the switching element disposed on the printed circuit board;
   a positive power supply circuit to generate a positive voltage relative to a ground potential, the positive power supply circuit disposed on the printed circuit board;
   a negative power supply circuit to generate a negative voltage relative to the ground potential, the negative power supply circuit disposed on the printed circuit board; and
   a driving circuit to supply the positive voltage to the gate electrode to turn on the switching element, the driving circuit supplying the negative voltage to the gate electrode to turn off the switching element,
   wherein the wiring includes a conducting path from the negative power supply circuit to the gate electrode via the driving circuit, the conducting path including a negative power supply wiring between the negative power supply circuit and the driving circuit,
   wherein the negative power supply wiring at least partially includes a negative power supply solid pattern.

2. The switching circuit as claimed in claim 1, wherein the negative power supply circuit and the driving circuit are disposed on a first side of the printed circuit board, wherein the negative power supply wiring is disposed on a surface layer of the first side of the printed circuit board with the negative power supply solid pattern.

3. The switching circuit as claimed in claim 2, wherein the switching element is disposed on the first side of the printed circuit board in addition to the negative power supply circuit and the driving circuit,
   wherein the conducting path is disposed on the surface layer of the first side of the printed circuit board.

4. The switching circuit as claimed in claim 3, wherein the driving circuit is disposed closer to the switching element than to the negative power supply circuit in the direction perpendicular to a thickness direction of the printed circuit board.

5. The switching circuit as claimed in claim 1, wherein the switching element and the driving circuit are disposed on the first side of the printed circuit board,
   wherein the negative power supply solid pattern is disposed on a surface layer of an opposite side to the first side of the printed circuit board.

6. The switching circuit as claimed in claim 1, wherein the printed circuit board further includes at least one ground solid pattern on at least one inner layer formed therein,
wherein the negative power supply solid pattern is disposed on a different inner layer from the inner layer on which the at least one ground solid pattern is disposed,
wherein the at least one ground solid pattern overlaps with the negative power supply solid pattern in the thickness direction of the printed circuit board.

7. The switching circuit as claimed in claim 6, wherein the ground solid patterns sandwich the negative power supply solid pattern therebetween in the thickness direction of the printed circuit board.

8. The switching circuit as claimed in claim 1, wherein the printed circuit board has at least one inner layer,
wherein the switching element and the driving circuit are disposed on a first side of the printed circuit board,
wherein the negative power supply solid pattern is disposed on an inner layer closer to a rear side than to the first side of the printed circuit board, the rear side opposite the first side of the printed circuit board.

9. The switching circuit as claimed in claim 1, further comprising:
a positive power supply wiring to connect the positive power supply circuit with the driving circuit in the printed circuit board, the positive power supply wiring at least partially includes a positive power supply solid pattern; and
a ground solid pattern disposed between the positive power supply solid pattern and the negative power supply solid pattern in a thickness direction of the printed circuit board.

10. The switching circuit as claimed in claim 1, further comprising:
a positive power supply wiring to connect the positive power supply circuit with the driving circuit in the printed circuit board, the positive power supply wiring at least partially including a positive power supply solid pattern; and
a ground solid pattern disposed between the positive power supply solid pattern and the negative power supply solid pattern, both of the positive power supply solid pattern and the negative power supply solid pattern disposed on the same layer in the printed circuit board.

11. A method of manufacturing a switching circuit on a printed circuit board composed of an insulation substrate, the method comprising the steps of:
disposing a switching element with a gate electrode on the insulation substrate;
disposing a positive power supply circuit on the insulation substrate to generate a positive voltage relative to a ground potential;
disposing a negative power supply circuit on the insulation substrate to generate a negative voltage relative to the ground potential;
disposing a driving circuit on the insulation substrate to selectively supply the positive voltage and the negative voltage to the gate electrode to turn on and off the switching element, respectively;
wiring the insulation substrate to electrically connect the switching element, the positive power supply circuit, the negative power supply circuit, and the negative power supply circuit;
forming a conducting path in a wiring portion from the negative power supply circuit to the gate electrode via the driving circuit;
providing a negative power supply wiring in the conducting path between the negative power supply circuit and the driving circuit; and
at least partially providing a negative power supply solid pattern in the negative power supply wiring.

* * * * *